(12) United States Patent
Jung

(10) Patent No.: US 7,545,204 B2
(45) Date of Patent: Jun. 9, 2009

(54) SEMICONDUCTOR DEVICE

(75) Inventor: Ho Don Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 167 days.

(21) Appl. No.: 11/463,650

(22) Filed: Aug. 10, 2006

(65) Prior Publication Data

US 2007/0146060 A1    Jun. 28, 2007

(30) Foreign Application Priority Data

Dec. 28, 2005    (KR) ................ 10-2005-0132469

(51) Int. Cl.
*G05F 3/02* (2006.01)
(52) U.S. Cl. .................... 327/540; 327/538
(58) Field of Classification Search ........... 327/530, 327/538, 540, 541, 543
See application file for complete search history.

(56) References Cited

U.S. PATENT DOCUMENTS

| | | | | |
|---|---|---|---|---|
| 5,352,935 | A | * | 10/1994 | Yamamura et al. .......... 327/540 |
| 6,005,819 | A | * | 12/1999 | Shin ........................ 365/226 |
| 6,721,232 | B2 | * | 4/2004 | Kashiwazaki .......... 365/189.15 |
| 7,042,781 | B2 | | 5/2006 | Kim |
| 7,173,480 | B2 | * | 2/2007 | Kim et al. ................... 327/538 |
| 7,231,537 | B2 | * | 6/2007 | Nobunaga ................... 713/401 |
| 2005/0231269 | A1 | | 10/2005 | Kim et al. |
| 2005/0249004 | A1 | | 11/2005 | Seo |
| 2006/0132195 | A1 | | 6/2006 | Kim et al. |

FOREIGN PATENT DOCUMENTS

JP    10-2005-0041055    5/2005

\* cited by examiner

*Primary Examiner*—Lincoln Donovan
*Assistant Examiner*—Hai L. Nguyen
(74) *Attorney, Agent, or Firm*—Marshall, Gerstein & Borun LLP

(57) ABSTRACT

A semiconductor device is disclosed which can perform a stable data inputting operation by overdriving a terminal supplying an internal voltage used as a drive voltage for a write driver such that the internal voltage is maintained in a predetermined range irrespective of a continuous write operation. The semiconductor device includes an internal voltage generator which generates an internal voltage corresponding to a predetermined reference voltage, and outputs the generated internal voltage to an internal voltage supply terminal, an overdriver which overdrives the internal voltage supply terminal for a predetermined period of time in response to an enable state of a control signal, the control signal being enabled in a write operation, and a write driver which is enabled in response to the control signal, to drive data transferred via a global data bus line using a voltage supplied from the internal voltage supply terminal, and to output the driven data to a local data bus line.

24 Claims, 5 Drawing Sheets

VCORE Level and LIO Signal in Conventional Case

Control Signal and VCORE Level in Present Invention

SEMICONDUCTOR DEVICE

BACKGROUND

1. Technical Field

This patent relates to a semiconductor device, and, more particularly, to a semiconductor device which can perform a stable data inputting operation by overdriving a terminal supplying an internal voltage used as a drive voltage for a write driver such that the internal voltage is maintained in a predetermined range irrespective of a continuous write operation.

2. Description of the Related Art

Semiconductor devices, in particular, dynamic random access memories (DRAMs), include a separate internal voltage generator to generate a drive voltage for a write driver. That is, the write driver uses an internal voltage generated and supplied from the internal voltage generator for a drive voltage to drive data input via a global data bus line, and thus, to output the data to a local data bus line.

FIG. 1 illustrates a configuration of a conventional semiconductor device which includes an internal voltage generator and a write driver. Hereinafter, operation of the semiconductor device illustrated in FIG. 1 will be described in detail. When a predetermined time elapses after the semiconductor device enters an active state, an internal voltage enable signal VINT_ACT is enabled to enable generation of an internal voltage. In response to the internal voltage enable signal VINT_ACT, an internal voltage generator 110 generates an internal voltage VCORE. In this case, the internal voltage generator 110 compares the internal voltage VCORE with a reference voltage VRC, thereby controlling the internal voltage VCORE such that the internal voltage VCORE is maintained in a predetermined range with respect to the reference voltage VRC.

When a write command is subsequently input, a write enable signal BWEN is enabled. In response to the write enable signal BWEN, the write driver 120 drives global input data GIO to the level of the internal voltage VCORE, and thus, outputs the resultant data as local input data LIO.

In the semiconductor device having the above-mentioned configuration, however, there is a problem in that, when the semiconductor device operates at high speed, it is impossible to produce local input data LIO having a stable voltage level because the level of the internal voltage VCORE is lowered due to the high-speed operation of the semiconductor device. That is, as the semiconductor device operates at a higher speed, the amount of current required in a continuous write operation is gradually increased. For this reason, the internal voltage VCORE, which is supplied to the write driver 120 after being generated by the internal voltage generator 110 in the conventional semiconductor device, cannot sufficiently provide the amount of current required in the continuous write operation. Furthermore, the level of the internal voltage VCORE is also gradually lowered, as shown in FIG. 2. As a result, the conventional semiconductor device cannot produce local input data LIO having a stable voltage level.

SUMMARY OF THE INVENTION

A semiconductor device can perform a stable data inputting operation by overdriving a terminal supplying an internal voltage used as a drive voltage for a write driver such that the internal voltage is maintained in a predetermined range irrespective of a continuous write operation.

A semiconductor device may include an internal voltage generator which generates an internal voltage corresponding to a predetermined reference voltage, and outputs the generated internal voltage to an internal voltage supply terminal; an overdriver which overdrives the internal voltage supply terminal for a predetermined period of time in response to an enable state of a control signal, the control signal being enabled in a write operation; and a write driver which is enabled in response to the control signal, to drive data transferred via a global data bus line using a voltage supplied from the internal voltage supply terminal, and to output the driven data to a local data bus line.

The overdriver may include a signal generator which generates an overdrive enable signal, the overdrive enable signal being enabled for a predetermined period of time in response to the enable state of the control signal, and a pull-up driver which pulls up the internal voltage supply terminal using an external voltage in response to the overdrive enable signal.

The signal generator may include a delay which delays the control signal for a predetermined delay time, and a logic unit which logically operates the control signal and a signal output from the delay, and outputs a result of the logical operation.

The signal generator may include a buffer which buffers the control signal, a delay which delays a signal output from the buffer for a predetermined delay time, and a logic unit which logically operates the output signal from the buffer and a signal output from the delay, and outputs a result of the logical operation.

The logic unit may perform a NANDing operation.

The logic unit may perform an ANDing operation.

The delay may include a plurality of delay elements and a plurality of control switches, and controls the delay time in accordance with operations of the control switches.

The delay may include a first delay which is connected between a first node and a second node, a first switch which is connected between the first node and the second node in parallel to the first delay, and a second delay which delays a signal from the second node.

The pull-up driver may include a plurality of pull-up devices which are connected in parallel between an external voltage supply terminal and the internal voltage supply terminal.

The pull-up driver may further include a plurality of control switches, a part of the pull-up devices being controlled to be turned on/off by the control switches.

The internal voltage generator may include a comparator which compares the internal voltage with the reference voltage in response to an internal voltage enable signal, and outputs a first enable signal in accordance with a result of the comparison, and an internal voltage driver which pulls up the internal voltage to a level of an external voltage in response to the first enable signal.

The comparator may include a first pull-up device which is connected between an external voltage supply terminal and a first node, a second pull-up device which is connected between the external voltage supply terminal and a second node, a first pull-down device which is connected between the first node and a ground terminal, to receive, as a drive voltage, the reference voltage at a gate of the first pull-down device, and a second pull-down device which is connected between the second node and the ground terminal, to receive, as a drive voltage, the internal voltage at a gate of the second pull-down device.

The semiconductor device may further include a comparator enabling unit which receives the internal voltage enable signal, and enables the comparator in response to the received internal voltage enable signal.

The comparator enabling unit may include a pull-up device which outputs the comparator enable signal when the internal voltage enable signal is enabled, and a pull-down device which outputs a disable signal to disable the comparator when the internal voltage enable signal is disabled.

The write driver may include a data transfer unit which drives the data transferred via the global data bus line to a level of the voltage supplied from the internal voltage supply terminal, and outputs the driven data, a logic unit which logically operates the control signal enabled in the write operation and a predetermined pre-charge signal, and a pre-charging unit which pre-charges the local data bus line in response to a signal output from the logic unit.

The logic unit may perform a NANDing operation.

The logic unit may perform an ANDing operation.

The control signal may be a write enable signal.

The internal voltage may be a core voltage of the semiconductor device.

BRIEF DESCRIPTION OF THE DRAWINGS

Various features and advantages of the present invention will become more apparent after reading the following detailed description when taken in conjunction with the drawings, in which.

DETAILED DESCRIPTION

Hereinafter, the present invention will be described in detail, in conjunction with exemplary embodiments. These embodiments are used only for illustrative purposes, and the present invention is not limited thereto.

Figure 1:
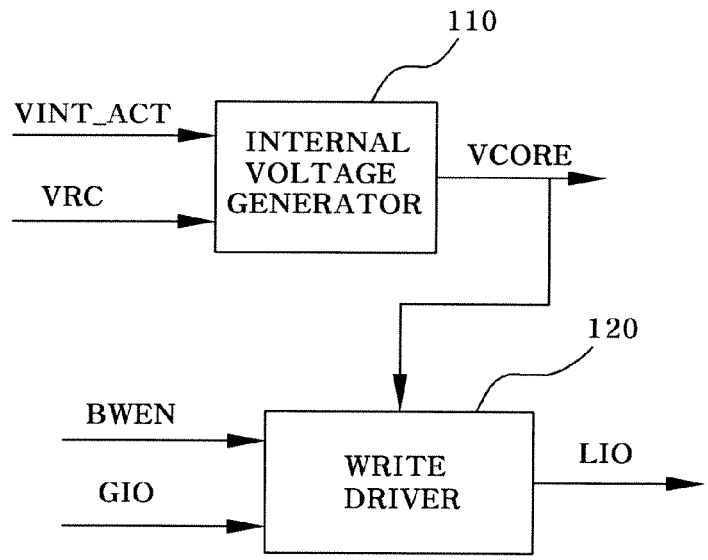
FIG. 1 is a block diagram illustrating a configuration of a conventional semiconductor device.
Figure 2:
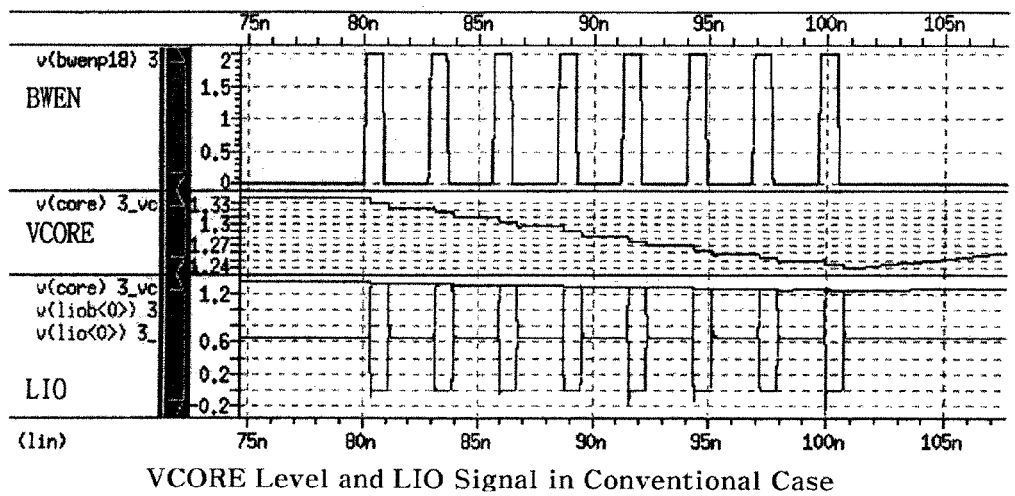
FIG. 2 is a graph depicting a variation in internal voltage occurring during a write operation in the conventional semiconductor device.
Figure 3:
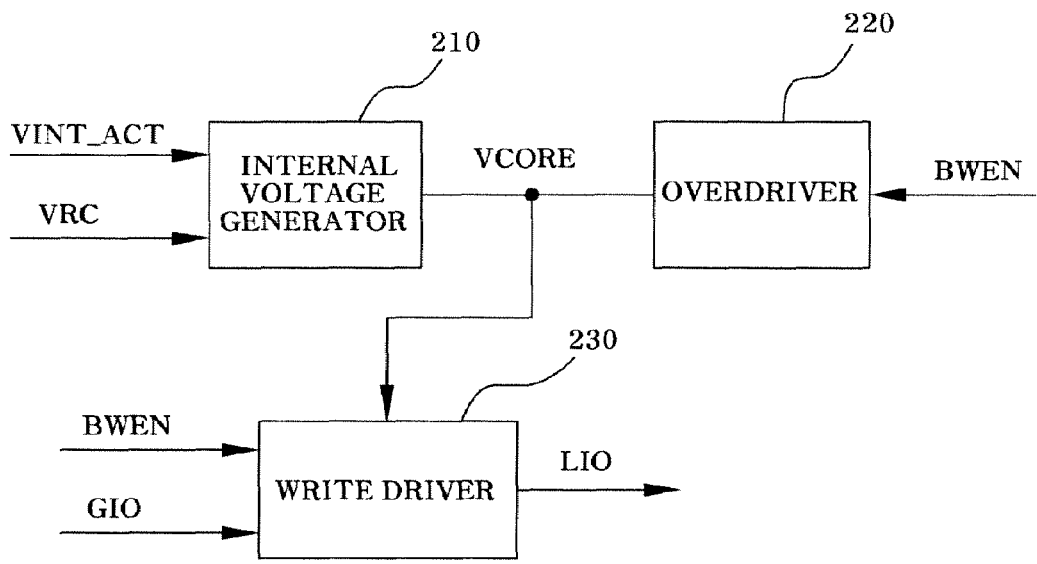
FIG. 3 is a block diagram illustrating a configuration of a semiconductor device according to an exemplary embodiment.
Figure 4:
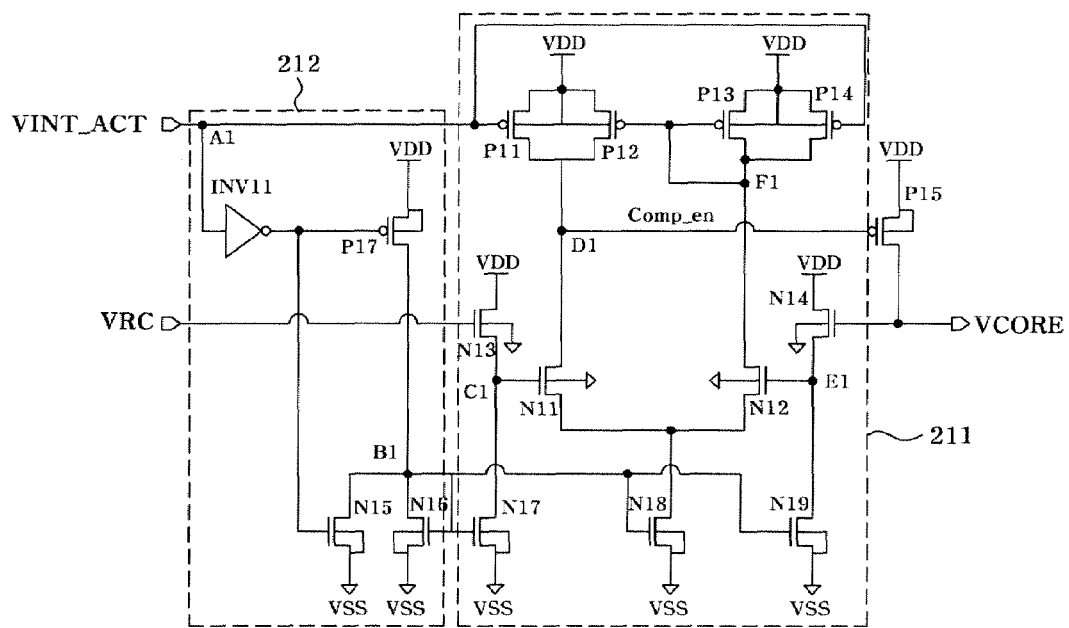
FIG. 4 is a circuit diagram illustrating a configuration of an internal voltage generator used in the semiconductor device according to the illustrated embodiment.
Figure 5:
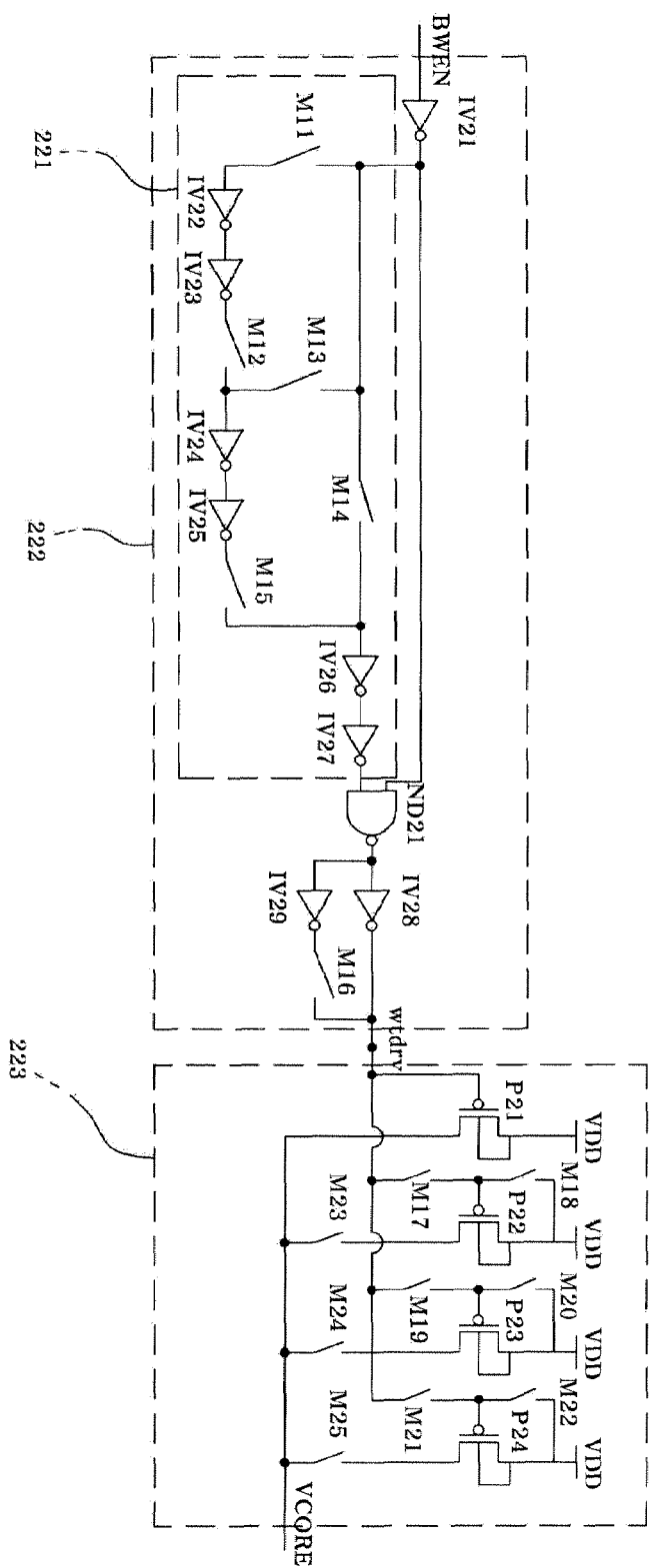
FIG. 5 is a circuit diagram illustrating a configuration of an overdriver used in the semiconductor device according to the illustrated embodiment.
Figure 6:
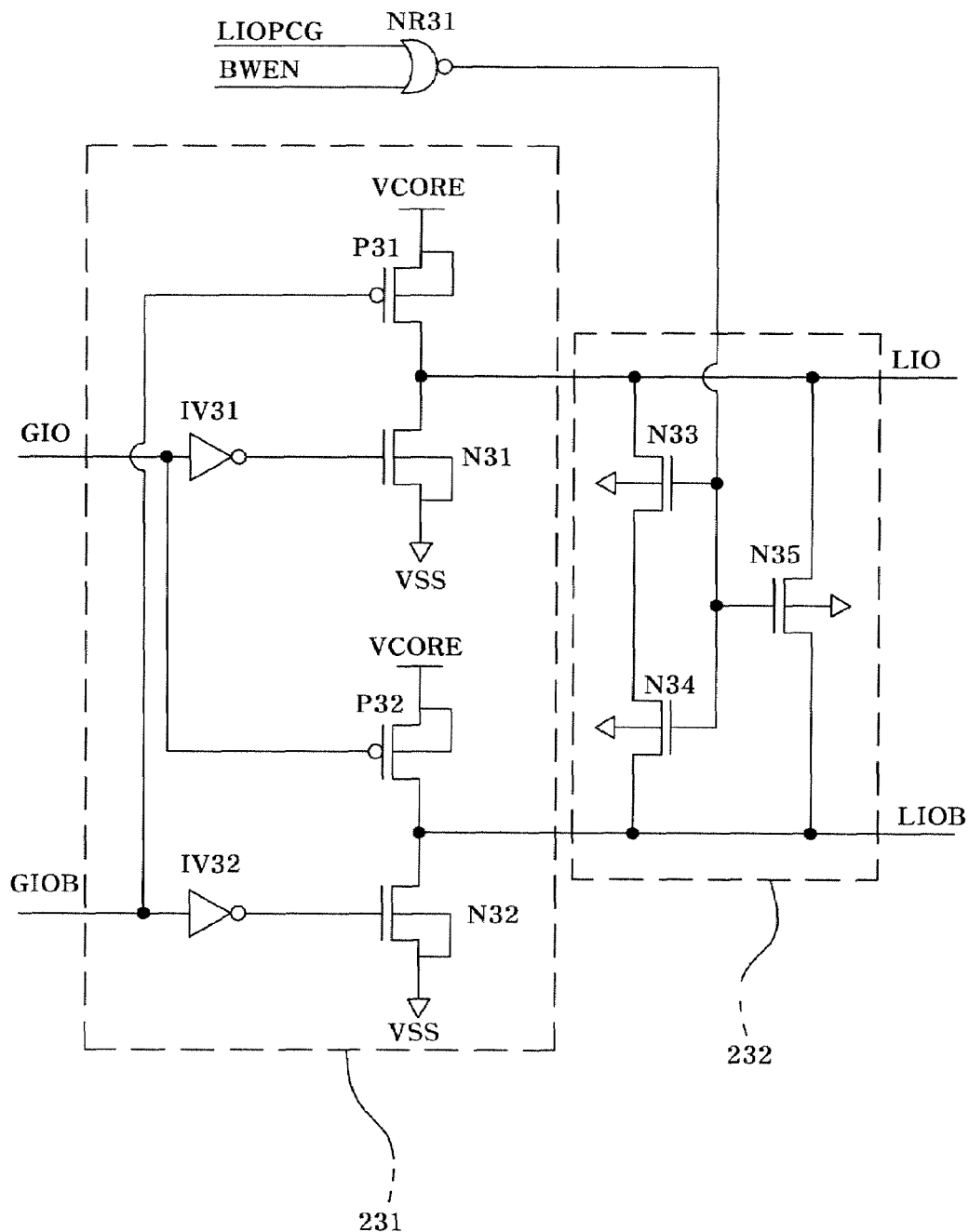
FIG. 6 is a circuit diagram illustrating a configuration of a write driver used in the semiconductor device according to the illustrated embodiment.

FIG. 3 illustrates a configuration of a semiconductor device according to an exemplary embodiment. FIG. 4 illustrates a configuration of an internal voltage generator used in the semiconductor device according to the illustrated embodiment. FIG. 5 illustrates a configuration of an overdriver used in the semiconductor device according to the illustrated embodiment. FIG. 6 illustrates a configuration of a write driver used in the semiconductor device according to the illustrated embodiment.

As shown in FIG. 3, the semiconductor device according to the illustrated embodiment includes an internal voltage generator 210 which generates an internal voltage VCORE corresponding to a predetermined reference voltage VRC, and outputs the generated internal voltage VCORE to an internal voltage supply terminal. The semiconductor device also includes an overdriver 220 which overdrives the internal voltage supply terminal in response to an enable state of a write enable signal BWEN which is enabled for a predetermined period of time to enable a write operation to be performed. The semiconductor device further includes a write driver 230 which is enabled in response to the write enable signal BWEN, to drive data transferred thereto via a global data bus line GIO using the voltage supplied from the internal voltage supply terminal, and to output the resultant data to a local data bus line L10.

As shown in FIG. 5, the overdriver 220 includes a signal generator 222 which generates an overdrive enable signal wtdrv, which is enabled for a predetermined period of time, in response to the enable state of the write enable signal BWEN, and a pull-up driver 223 which pulls up the internal voltage supply terminal using an external voltage VDD in response to the overdrive enable signal wtdrv. The signal generator 222 includes a delay 221 which delays a signal obtained after buffering the write enable signal BWEN for a predetermined delay time, and a NAND gate ND21 which NANDs the buffered signal of the write enable signal BWEN and the output signal of the delay 221, and outputs the result of the NANDing operation.

Hereinafter, operation of the semiconductor device having the above-described configuration according to the illustrated embodiment will be described with reference to FIGS. 3 to 7.

When a predetermined time elapses after the semiconductor device enters an active state, an internal voltage enable signal VINT_ACT is enabled to enable generation of an internal voltage. In response to the internal voltage enable signal VINT_ACT, the internal voltage generator 210 generates an internal voltage VCORE. In this case, the internal voltage generator 210 compares the internal voltage VCORE with a reference voltage VRC, thereby controlling the internal voltage VCORE such that the internal voltage VCORE is maintained in a predetermined range with respect to the reference voltage VRC. This operation will be described in detail with reference to FIG. 4.

When a predetermined time elapses after the semiconductor device enters an active state, an internal voltage enable signal VINT_ACT of an enabled state, namely, a high level state, is applied to a node A1 connected to a comparator enabling unit 212. In the comparator enabling unit 212, the internal voltage enable signal VINT_ACT is inverted to a low level by an inverter INV11, and is then applied to a gate of a PMOS transistor (hereinafter, simply referred to as a "PMOS") P17. Accordingly, the PMOS P17 is turned on. As a result, a node B1 connected to the PMOS P17 is pulled up to a high level. The resultant high-level signal at the node B1 is applied to a gate of an NMOS transistor (hereinafter, simply referred to as an "NMOS") N18 which is, in turn, turned on, thereby enabling a comparator 211 to operate. Thereafter, the comparator 211 compares the internal voltage VCORE with the reference voltage VRC, and determines, based on the result of the comparison, whether or not a PMOS P15 should be turned on, in order to maintain the level of the internal voltage VCORE in a predetermined range. That is, when the internal voltage VCORE is lower than the reference voltage VRC, an NMOS N13 is turned on which receives, at a gate thereof, the reference voltage VRC, because the reference voltage VRC has a relatively higher level. Accordingly, a node C1, which is connected to the NMOS N13, is pulled up to a high level. The resultant high-level signal at the node C1 is applied to a gate of an NMOS N11 which is, in turn, turned on. As a result, a node D1, which is connected to the NMOS N11, is pulled down to a ground level. The resultant low-level signal at the node D1 is applied to the gate of the PMOS P15 which is, in turn, turned on, thereby pulling up the internal voltage VCORE to the level of the external voltage VDD.

Thus, the internal voltage VCORE is increased in level in accordance with the pull-up thereof.

On the other hand, when the internal voltage VCORE is higher than the reference voltage VRC, an NMOS N14 is turned on which receives, at a gate thereof, the internal voltage VCORE, because the internal voltage VCORE has a relatively higher level. Accordingly, a node E1, which is connected to the NMOS N14, is pulled up to a high level. The resultant high-level signal at the node E1 is applied to a gate of an NMOS N12 which is, in turn, turned on. As a result, a node F1, which is connected to the NMOS N12, is pulled down to a ground level. The resultant low-level signal at the node F1 is applied to the gate of the PMOS P12 which is, in turn, turned on, thereby pulling up the node D1 to a high level. Since the resultant high-level signal is applied to the gate of the PMOS 15, the PMOS 15 is turned off, thereby causing the internal voltage VCORE to be decreased in level. Thus, the comparator 211 functions to maintain the internal voltage VCORE in a predetermined range in accordance with the above-described operations.

When a write command is subsequently input, the write enable signal BWEN is enabled. Here, the write enable signal BWEN is a signal which is enabled for a predetermined period of time in response to input of the write command, in order to enable a write operation to be performed. The write driver 230 drives the global input data GIO to the level of the internal voltage VCORE in response to the write enable signal BWEN, and outputs the resultant data as local input data LIO. Hereinafter, the operation of the write driver 230 will be described in detail with reference to FIG. 6.

In a configuration of FIG. 6, when a pre-charge signal LIOPCG and a write enable signal BWEN, which are applied to the write driver 230, have a low level, a NOR gate NR31 outputs a high-level signal. As a result, NMOSs N33, N34, and N35 are turned on, thereby causing local data bus lines LIO and LIOB to be pre-charged. However, when the write enable signal BWEN subsequently transits a high level state, namely, an enable state, in accordance with input of a write command, the NOR gate NR31 outputs a low-level signal. As a result, the NMOSs N33, N34, and N35 are turned off. Accordingly, data input via the global data bus lines GIO and GIOB is driven to the level of the internal voltage VCORE, so that the resultant data can be transmitted via the local data bus lines LIO and LIOB.

That is, when the data GIO has a high level, an NMOS N31 and a PMOS P32 are turned off, and an NMOS N32 and a PMOS P31 are turned on. Accordingly, the local data bus line LIO is driven to the level of the internal voltage VCORE, whereas the local data bus line LIOB is driven to the level of a ground voltage VSS. On the other hand, when the data GIO has a low level, the NMOS N31 and PMOS P32 are turned on, and the NMOS N32 and PMOS P31 are turned off. Accordingly, the local data bus line LIO is driven to the level of the ground voltage VSS, whereas the local data bus line LIOB is driven to the level of the internal voltage VCORE. Thus, the write driver 230 drives the global input data GIO to the level of the internal voltage VCORE when a write command is input, thereby outputting the local input data LIO. Meanwhile, in accordance with another embodiment, inverted signals of the pre-charge signal LOPCG and write enable signal BWEN may be used. Also, a logic element for performing an ANDing operation may be used in place of the NOR gate NR31.

Meanwhile, when a write operation is continuously carried out in an active state of the semiconductor device, the amount of internal current consumed during a driving operation of the write driver 230 is increased. As a result, the level of the internal voltage VCORE may become instable, as in conventional cases. To this end, the semiconductor device according to the illustrated embodiment includes the overdriver 220 which overdrives the internal voltage supply terminal in a write operation using an external voltage, thereby compensating for an insufficient driving ability of the internal voltage VCORE. Hereinafter, the operation of the overdriver 220 will be described in detail with reference to FIG. 5.

Figure 7:
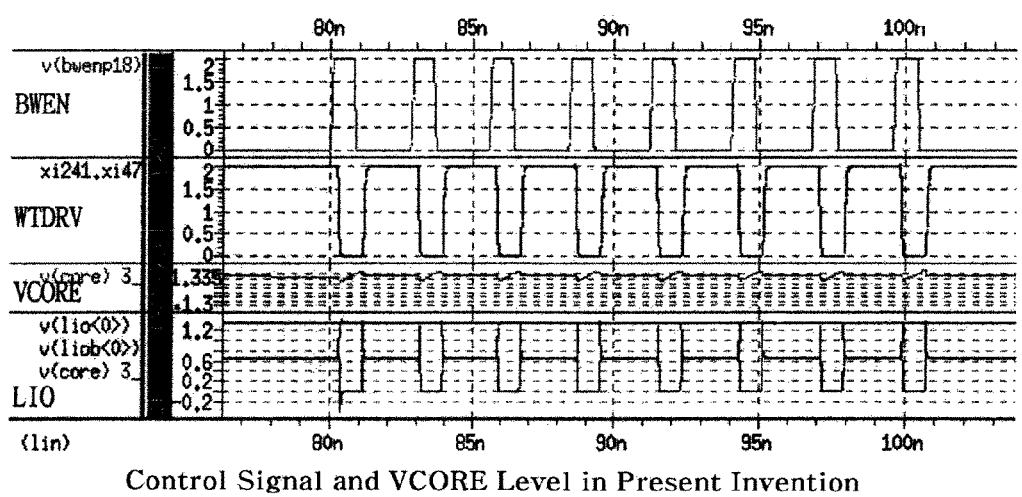
FIG. 7 is a graph depicting a variation in internal voltage occurring during a write operation in the semiconductor device according to the illustrated embodiment.

The write enable signal BWEN is maintained in a low level state until a write command is input in an active state of the semiconductor device, as shown in FIG. 7. When the write enable signal BWEN is in a low level state, in the configuration of FIG. 5, an inverter IV21 outputs a high-level signal. A NAND gate ND21 receives high-level signals at both input terminals thereof, thereby outputting a low-level signal. An inverter IV28, which is connected to an output of the NAND gate ND21, inverts the low-level signal, thereby outputting an overdrive enable signal wtdrv having a high level. Accordingly, the pull-up devices of the pull-up driver 223, namely, PMOSs P21 to P24, are turned off irrespective of the states of switches M17 to M25.

When a write command is subsequently input in the active state of the semiconductor device, the write enable signal BWEN transits from a low level to a high level, as shown in FIG. 7. As a result, the inverter IV21 outputs a low-level signal which is, in turn, applied to one input terminal of the NAND gate ND21. Accordingly, the NAND gate ND21 outputs a high-level signal irrespective of a signal output from the delay 221. The inverter IV28 inverts the high-level signal, thereby outputting an overdrive enable signal wtdrv having a low level. As a result, the PMOS P21 of the pull-up driver 223 is turned on, thereby overdriving the internal voltage supply terminal using the external voltage VDD.

In this case, the remaining pull-up devices of the pull-up driver 223, namely, the PMOSs P22 to P24, are determined to be turned on or off under the control of the switches M17 to M25. That is, in the illustrated embodiment, the number of the turned-on pull-up devices in the pull-up driver 223 is controlled to appropriately control a required overdriving intensity in accordance with system conditions. For example, where it is possible to obtain a sufficient overdriving intensity using the PMOS P21 alone, all the switches M17 to M25 are turned off. On the other hand, when an increased amount of current is required in the driving operation of the write driver 230, all the switches M17 to M25 are turned on such that all the PMOSs P21 to P24 pull up the internal voltage supply terminal.

When the write enable signal BWEN re-transits from the high level to the low level, the inverter IV21 outputs a high-level signal which is, in turn, applied to one input terminal of the NAND gate ND21. In this case, however, the signal applied to the other input terminal of the NAND gate ND21 maintains a previous level, namely, a low level, until a predetermined delay time given by the delay 221 elapses. After the predetermined delay time, a high-level signal is input to the other input terminal of the NAND gate ND21. Accordingly, the overdrive enable signal wtdrv is maintained in a low-level state until the delay time elapses because the NAND gate ND21 continuously outputs a high-level signal. As a result, the overdrive enable signal wtdrv is maintained in a low-level state, thereby causing the pull-up driver 223 to continuously overdrive the internal voltage supply terminal. Thus, the overdrive enable signal wtdrv, which controls the overdriving operation of the pull-up driver 223, transits to a low-level state, namely, an enable state, in response to transition of the write enable signal BWEN to a high-level state, namely, an enable state, and subsequently transits to a high-level state, namely, a disable state, when the delay time elapses after the write enable signal BWEN transits to a low-level state, namely, a disable state.

When the write operation is continuously carried out as the write enable signal BWEN is repeatedly enabled, as shown in FIG. 7, the overdrive enable signal wtdrv is also repeatedly enabled in response to the repeated write operation. Accordingly, the overdriver 220 repeatedly performs the overdriving operation, thereby increasing the driving ability of the internal voltage VCORE.

Meanwhile, in the illustrated embodiment, the delay time given by the delay 221 is controlled by the switches M11 to M15. That is, the delay time is controlled by controlling the number of delay elements in the delay 221, in order to appropriately control a required overdriving intensity in accordance with system conditions in the illustrated embodiment. For example, where it is possible to obtain a sufficient overdriving intensity in a more or less short overdriving period, only the switch M14 is turned on, and all remaining switches of the delay 221 are turned off. Thus, the delay time of the delay 221 is reduced, thereby causing the overdriving period to be shortened. On the other hand, when it is necessary to use an increased amount of current during the driving operation of the write driver 230, the delay time is increased by turning off the switches M13 and M14, and turning on the switches M11, M12, and M15, thereby causing the overdriving period to be lengthened. Also, it is possible to set the overdriving period to be intermediate between the overdriving periods of the above-described two cases by turning on the switches M13 and M15, and turning off the switches M11, M12, and M14. Meanwhile, an inverter IV29 may be provided to selectively increase the driving ability of the inverter IV28.

Thus, the semiconductor device according to the illustrated embodiment overdrives the terminal supplying the internal voltage VCORE used as the drive voltage of the write driver 230 in a write operation, to increase the driving ability of the internal voltage VCORE such that the internal voltage VCORE copes with an increase in the consumption of internal current caused by a continuous write operation. Accordingly, it is possible to maintain the internal voltage VCORE within a predetermined range in spite of a continuous write operation, as shown in FIG. 7.

As apparent from the above description, the semiconductor device according to various described embodiments can perform a stable data inputting operation by overdriving a terminal supplying an internal voltage used as a drive voltage for a write driver such that the internal voltage is maintained in a predetermined range irrespective of a continuous write operation.

Although various embodiments have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
   an internal voltage generator which generates an internal voltage corresponding to a predetermined reference voltage, and outputs the generated internal voltage to an internal voltage supply terminal;
   a signal generator which generates an overdrive enable signal in response to a control signal, the control signal being enabled in a write operation;
   a pull-up driver which pulls up the internal voltage supply terminal using an external voltage in response to the overdrive enable signal; and
   a write driver which is enabled in response to the control signal, to drive data transferred via a global data bus line using a voltage supplied from the internal voltage supply terminal, and to output the driven data to a local data bus line,
   wherein the overdrive enable signal is enabled signal when the control signal transits to a enable state, the overdrive enable signal is disabled when the delay time elapses after the control signal transits to a disable state.

2. The semiconductor device according to claim 1, wherein the control signal is a write enable signal.

3. The semiconductor device according to claim 1, wherein the internal voltage is a core voltage of the semiconductor device.

4. The semiconductor device according to claim 1, wherein the pull-up driver includes a plurality of pull-up devices which are connected in parallel between an external voltage supply terminal and the internal voltage supply terminal.

5. The semiconductor device according to claim 4, wherein the pull-up driver further includes a plurality of control switches, a part of the pull-up devices being controlled to be turned on/off by the control switches.

6. The semiconductor device according to claim 1, wherein the signal generator includes:
   a delay which delays the control signal for a predetermined delay time; and
   a logic unit which logically operates the control signal and a signal output from the delay, and outputs a result of the logical operation.

7. The semiconductor device according to claim 3, wherein the logic unit performs an ANDing operation.

8. The semiconductor device according to claim 6, wherein the logic unit performs a NANDing operation.

9. The semiconductor device according to claim 6, wherein the delay includes a plurality of delay elements and a plurality of control switches, and controls the delay time in accordance with operations of the control switches.

10. The semiconductor device according to claim 9, wherein the delay includes:
    a first delay which is connected between a first node and a second node;
    a first switch which is connected between the first node and the second node in parallel to the first delay; and
    a second delay which delays a signal from the second node.

11. The semiconductor device according to claim 1, wherein the signal generator includes:
    a buffer which buffers the control signal;
    a delay which delays a signal output from the buffer for a predetermined delay time; and
    a logic unit which logically operates the output signal from the buffer and a signal output from the delay, and outputs a result of the logical operation.

12. The semiconductor device according to claim 11, wherein the logic unit performs a NANDing operation 13. The semiconductor device according to claim 11, wherein the logic unit performs an ANDing operation.

14. The semiconductor device according to claim 11, wherein the delay includes a plurality of delay elements and a plurality of control switches, and controls the delay time in accordance with operations of the control switches.

15. The semiconductor device according to claim 14, wherein the delay includes:
    a first delay which is connected between a first node and a second node;
    a first switch which is connected between the first node and the second node in parallel to the first delay; and
    a second delay which delays a signal from the second node.

16. The semiconductor device according to claim 1, wherein the internal voltage generator includes:
   a comparator which compares the internal voltage with the reference voltage in response to an internal voltage enable signal, and outputs a first enable signal in accordance with a result of the comparison; and
   an internal voltage driver which pulls up the internal voltage to a level of an external voltage in response to the first enable signal.

17. The semiconductor device according to claim 16, further comprising:
   a comparator enabling unit which receives the internal voltage enable signal, and enables the comparator in response to the received internal voltage enable signal.

18. The semiconductor device according to claim 17, wherein the comparator enabling unit includes:
   a pull-up device which outputs the comparator enable signal when the internal voltage enable signal is enabled; and
   a pull-down device which outputs a disable signal to disable the comparator when the internal voltage enable signal is disabled.

19. The semiconductor device according to claim 16, wherein the comparator includes:
   a first pull-up device which is connected between an external voltage supply terminal and a first node;
   a second pull-up device which is connected between the external voltage supply terminal and a second node;
   a first pull-down device which is connected between the first node and a ground terminal, to receive, as a drive voltage, the reference voltage at a gate of the first pull-down device; and
   a second pull-down device which is connected between the second node and the ground terminal, to receive, as a drive voltage, the internal voltage at a gate of the second pull-down device.

20. The semiconductor device according to claim 19, further comprising:
   a comparator enabling unit which receives the internal voltage enable signal, and enables the comparator in response to the received internal voltage enable signal.

21. The semiconductor device according to claim 20, wherein the comparator enabling unit includes:
   a pull-up device which outputs the comparator enable signal when the internal voltage enable signal is enabled; and
   a pull-down device which outputs a disable signal to disable the comparator when the internal voltage enable signal is disabled.

22. The semiconductor device according to claim 1, wherein the write driver includes:
   a data transfer unit which drives the data transferred via the global data bus line to a level of the voltage supplied from the internal voltage supply terminal, and outputs the driven data;
   a logic unit which logically operates the control signal enabled in the write operation and a predetermined pre-charge signal; and
   a pre-charging unit which pre-charges the local data bus line in response to a signal output from the logic unit.

23. The semiconductor device according to claim 22, wherein the logic unit performs an ANDing operation.

24. The semiconductor device according to claim 22, wherein the logic unit performs a NANDing operation.

* * * * *